(12) United States Patent
Lai et al.

(10) Patent No.: US 6,462,405 B1
(45) Date of Patent: Oct. 8, 2002

(54) SEMICONDUCTOR PACKAGE

(75) Inventors: Cheng-Yuan Lai, Taichung; Chien-Ping Huang, Hsinchu, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/908,238

(22) Filed: Jul. 18, 2001

(30) Foreign Application Priority Data

Sep. 13, 2000 (TW) .......................................... 89118669

(51) Int. Cl.$^7$ ............................................. H01L 23/495
(52) U.S. Cl. .................... 257/675; 257/669; 257/706
(58) Field of Search ................................. 257/679, 669, 257/675, 706, 717, 720

(56) References Cited

U.S. PATENT DOCUMENTS

| | | | |
|---|---|---|---|
| 5,216,278 A | 6/1993 | Lin et al. ...................... | 257/688 |
| 5,610,442 A * | 3/1997 | Schneider et al. ........... | 257/706 |
| 6,198,171 B1 * | 3/2001 | Huang et al. ................ | 257/675 |
| 6,246,115 B1 * | 6/2001 | Tang et al. .................. | 257/675 |
| 2001/0019181 A1 * | 9/2001 | Lee et al. .................... | 257/675 |

FOREIGN PATENT DOCUMENTS

TW        87116851        9/1987

* cited by examiner

*Primary Examiner*—Phat X. Cao
(74) *Attorney, Agent, or Firm*—Peter F. Corless; Steven M. Jensen.; Edwards & Angell, LLP

(57) ABSTRACT

A semiconductor package is proposed, in which a lid is attached to a semiconductor chip and appropriately spaced apart from a heat sink having a top surface thereof exposed to the outside an encapsulant, so as to prevent external moisture from condensing on the semiconductor chip and reduce a thermal stress effect on the semiconductor chip. Moreover, a thermal conductive path is reduced in a portion passing through the encapsulant, allowing the heat-dissipating efficiency to be improved. In addition, with no contact between the heat sink and the semiconductor chip, quality of the semiconductor package is assured with no damage to the semiconductor chip.

20 Claims, 3 Drawing Sheets

SEMICONDUCTOR PACKAGE

FIELD OF THE INVENTION

The present invention relates to semiconductor packages, and more particularly, to a semiconductor package having a heat sink in which a top surface of the heat sink is exposed to the outside of the package for enhancing the heat-dissipating efficiency.

BACKGROUND OF THE INVENTION

A BGA (ball grid array) semiconductor package is advantageous for having sufficient I/O connections as required for a semiconductor chip having high density of electronic components and electrical circuits. Accordingly, heat is expected to be generated in a huge amount during operating such a densely equipped semiconductor chip. In other words, the heat dissipation is critical for maintaining the performance and lifetime of the semiconductor chip. However, as the conventional BGA semiconductor package typically has the semiconductor chip thereof encapsulated by an encapsulant, the heat usually can not be effectively dissipated to the atmosphere through the encapsulant, which is made of a molding resin having a small coefficient of thermal conductivity K being only about 0.8 w/m°K.

In addition, after forming the encapsulant for encapsulating the semiconductor chip, since the semiconductor chip has a coefficient of thermal expansion (CTE) about 3 ppm/°C. much smaller than that of the molding resin about 20 ppm/°C., the encapsulant has relatively greater extent in thermal expansion and cold shrinkage corresponding to significant temperature variation during a curing process for curing the encapsulant, a solder reflow process for soldering the semiconductor package on a printed circuit board, and a reliability test for the semiconductor package in a temperature cycle. Accordingly, certain thermal stress effect is generated from the encapsulant on the semiconductor chip, resulting in cracks in the semiconductor chip. Therefore, quality and production yield of the semiconductor package can not be assured.

In order to solve the foregoing problem of ineffectiveness in the heat dissipation, a BGA semiconductor package having a heat sink is proposed. Such a semiconductor package helps increase the heat-dissipating efficiency, however, since the heat generated from the semiconductor chip needs to be transmitted for a long path through the encapsulant with poor thermal conductivity to the atmosphere, the overall heat-dissipating efficiency of the semiconductor package is not satisfactory.

In accordance with the drawback depicted in the above BGA semiconductor package, U.S. Pat. No. 5,216,278 discloses a semiconductor package with a heat sink in which a top surface of the heat sink is exposed to the outside of the semiconductor package. As shown in FIG. 5, the semiconductor package 1 has the heat sink 10 thereof attached to a top surface of a semiconductor chip 12 through a thermally conductive adhesive layer 11, and an encapsulant 13 is formed for encapsulating the chip 12 in a manner that the top surface of the heat sink 10 is exposed to the outside of an encapsulant 13. This makes heat generated from the chip 12 dissipated to the atmosphere through a thermally conductive path constituted by the thermally conductive adhesive layer 11 and the heat sink 10 excluding the encapsulant 13, so that the heat-dissipating efficiency of the semiconductor package 1 can be greatly improved. However, as the heat sink 10 is directly attached to the top surface of the chip 12, the chip 12 is also subjected to a clamping effect generated by an encapsulating mold (not shown) on the heat sink 10 during a molding process, which makes the chip 12 cracked and quality of the semiconductor package 1 degraded. Furthermore, as the semiconductor chip has the CTE about 3 ppm/°C. much smaller than that of copper about 18 ppm/°C. used for making heat sink 10, the heat sink 10 induces a significantly thermal stress effect on the chip 12, and similarly, cracks occur in the chip 12 and production yield of the semiconductor packages 1 is degraded.

According to the defects depicted in the above semiconductor package, the present inventor proposes a semiconductor package having a heat sink in Taiwanese patent application No. 87116851. As shown in FIG. 6, the semiconductor package 2 has the heat sink 20 thereof similarly constructed as the heat sink in the foregoing semiconductor package, that is, a top surface 200 of the heat sink 20 is exposed to the atmosphere for enhancing the heat-dissipating efficiency of the heat sink 20. Moreover, a bottom surface 201 of the heat sink 20 is properly spaced apart from a semiconductor chip 22 for preventing the heat sink 20 from clamping the chip 22 during molding. As such, a molding resin used for forming an encapsulant 23 fills the space between the heat sink 20 and the chip 22, allowing heat generated by the chip 22 to be transmitted through the encapsulant 23 for dissipation, which definitely degrades the heat-dissipating efficiency of the heat sink 20 as previously described in the prior art. In addition, as the chip 22 is directly encapsulated by the encapsulant 23, a thermal stress effect from the encapsulant 23 on the chip 22 is induced, and thus the chip 22 may be damaged by cracking.

SUMMARY OF THE INVENTION

A primary objective of the present invention is to provide a semiconductor package in which a lid is attached to a semiconductor chip and appropriately spaced apart from a heat sink having a top surface thereof exposed to the outside an encapsulant, so as to prevent external moisture from condensing on the semiconductor chip and reduce a thermal stress effect on the semiconductor chip, as well as avoid cracks in the semiconductor chip in a temperature cycle. Moreover, a thermal conductive path is reduced in a portion passing through the encapsulant, allowing the heat-dissipating efficiency to be improved. In addition, with no contact between the heat sink and the semiconductor chip, quality of the semiconductor package is assured with no damage to the semiconductor chip.

According to the above and other objectives, a semiconductor package proposed in the present invention includes: a substrate having a first surface and a second surface; a semiconductor chip having a first surface and a second surface, while the second surface of the chip is attached to the first surface of the substrate; a plurality of first conductive members for electrically connecting the chip to the substrate; a lid attached to the first surface of the chip, and made of a material having a coefficient of thermal expansion similar to that of the chip; a heat sink mounted on the first surface of the substrate, and having a first surface and a second surface, while a gap is formed between the second surface of the heat sink and the lid; a plurality of second conductive members for electrically connecting the chip to an external device; and an encapsulant for encapsulating the chip, the lid, the first conductive members and the heat sink, while the first surface of the heat sink is exposed to the outside of the encapsulant.

In another embodiment of the invention, the semiconductor chip has the first surface thereof electrically connected to the substrate through solder bumps in a flip chip manner, and accordingly the lid is attached to the second surface of the chip.

The lid is made of a material having a coefficient of thermal expansion similar to that of the semiconductor chip, preferably made of a semiconductor material or a metallic material which can effectively transmit the heat generated by the semiconductor chip connected with the lid. More preferably, the lid is made from a defective wafer such that the lid has the same coefficient of thermal expansion as that of the semiconductor chip. Thus, a thermal stress effect on the first surface of the semiconductor chip in a temperature cycle can be minimized.

Furthermore, the gap between the lid and the heat sink is preferably from 0.03 mm to 0.45 mm, and more preferably from 0.05 mm to 0.30 mm. If the gap is too big, the rather thick encapsulant formed in the gap will detrimentally affect the heat-dissipating efficiency. If the gap is too small, the flow of a molding resin injected to the gap will slow down due to the increased resistance, which may result in the formation of voids between the lid and the heat sink. As a result, the voids tend to cause a popcorn effect in the semiconductor package in the temperature cycle, a reliability test and the actual operation, and thus quality of products is degrade. Moreover, the voids also lead to increase in the thermal resistance since the thermal conductivity of air is poorer than that of the encapsulant, so that the heat-dissipating efficiency will be reduced.

In addition, in order to further minimize the gap for reducing the overall thickness of the fabricated semiconductor package without the formation of the voids, on the first surface of the lid along a flow direction of the molding resin during molding there can be formed a plurality of grooves or flow channels for leading the flow of the molding resin, wherein the flow channels are built up between protrusions formed on the first surface of the lid. Similarly, the foregoing grooves or flow channels can also be formed on the second surface of the heat sink, or can be simultaneously formed on the second surface of the heat sink and the first surface of the lid.

BRIEF DESCRIPTION OF THE DRAWINGS

The present invention may best be understood through the following description with reference to the accompanying drawings, in which.

DETAILED DESCRIPTION OF THE PREFERRED EMBODIMENT

First Preferred Embodiment

Figure 1:
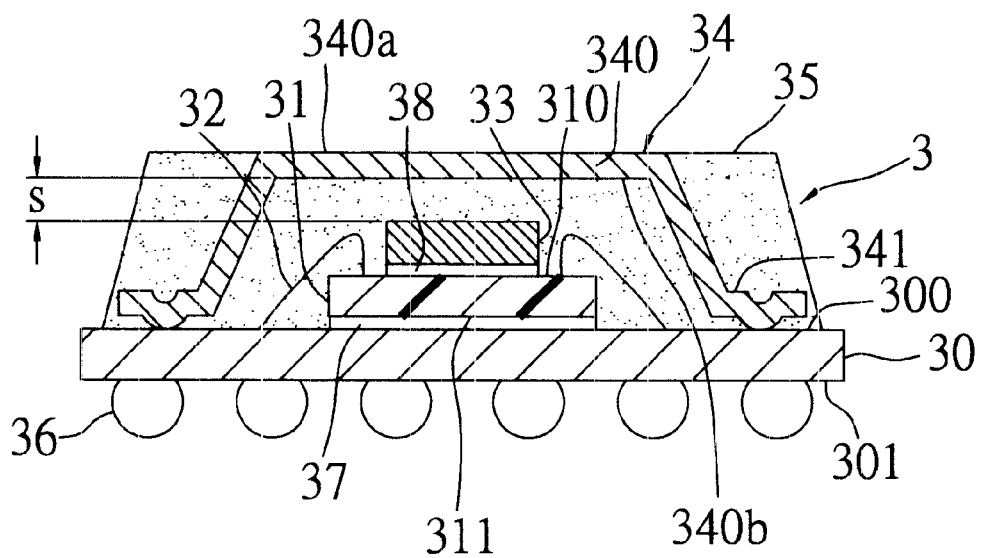
FIG. 1 is a sectional view of the semiconductor package of the first embodiment of the present invention.

Illustrated in FIG. 1 is a sectional view of the semiconductor package of the first embodiment of the present invention.

As shown in the drawing, the semiconductor package 3 includes a substrate 30, a semiconductor chip 31 attached to the substrate 30, a plurality of gold wires 32 for electrically connecting the chip 31 to the substrate 30, a lid 33 attached to the chip 31, a heat sink 34 mounted on the substrate 30, and an encapsulant 35 for encapsulating the chip 31, the gold wires 32, the lid 33, and part of the heat sink 34.

The substrate 30 has a first surface 300 mounted with a plurality of conductive traces (not shown) and a second surface 301 also provided with a plurality of conductive traces (not shown), and further a plurality of vias (not shown) are formed in the substrate 30 for electrically connecting the conductive traces on the first surface 300 to those on the second surface 301. Moreover, on the second surface 301 of the substrate 30 there are implanted a plurality of solder balls 36 for electrically connecting the semiconductor chip 31 to an external device such as a printed circuit board after the semiconductor chip 31 is electrically connected to the substrate 30. The substrate 30 is made of a material selected from a group consisting of epoxy resin, polyimide resin, triazine, a ceramic material, and a glass material, wherein bismaleimide triazine (BT) is preferred.

The semiconductor chip 31 has a first surface 310 mounted with a plurality of electronic components and electrical circuits and a second surface 311 attached to the first surface 300 of the substrate 30 through an adhesive 37 such as silver paste.

The lid 33 is made from a defective die having the same coefficient of thermal expansion as that of the semiconductor chip 31. After the encapsulant 35 is cured, the combination of the lid 33 and the semiconductor chip 31 can provide the chip 31 with a better mechanical strength so as to effectively reduce a thermal stress effect on the first surface 310 of the chip 31 generated by the encapsulant 35 in a temperature variation of subsequent manufacturing processes and in a temperature cycle of a reliability test. Accordingly, cracks in the semiconductor chip 31 are prevented from occurrence, as well as yield and reliability of the fabricated products are increased. Preferably, the lid 33 attached to the first surface 310 of the semiconductor chip 31 by means of a thermally conductive adhesive 38, which allows the heat generated from the first surface 310 to be effectively transmitted to the lid 33. Moreover, the lid 33 is smaller in size than the semiconductor chip 31 for preventing the lid 33 from contacting bond pads (not shown) on the first surface 310 as attaching the lid 33 to the chip 31, or for avoiding affecting a wire bonding process for the gold wires 32. However, when the gold wires 32 are reversely bonded between the substrate 30 and the semiconductor chip 31, the lid 33 can be of a size equal to or slightly larger than the chip 31.

The heat sink 34 is constructed by a plane 340 and support members 341 for positioning the plane 340 above the semiconductor chip 31 without contacting the lid 33 and the gold wires 32. The plane 340 has a first surface 340a exposed to the outside of the encapsulant 35, and a second surface 340b spaced apart from an upper surface of the lid 33 for forming a gap S between the heat sink 34 and the lid 33. The gap S is preferably from 0.03 mm to 0.45 mm, and more preferably from 0.05 mm to 0.30 mm, so as to avoid the formation of voids between the heat sink 34 and the lid 33 if the gap S is too small, and prevent the heat-dissipating efficiency from being detrimentally affected if the gap S is too big. Furthermore, with no contact between the heat sink 34 and the lid 33, the semiconductor chip 31 can be prevented from cracking during molding, and the thermal stress effect on the chip 31 can be greatly reduced. In addition, since the gap S between the lid 33 and the heat sink 34 is sufficiently small, the heat generated by the semiconductor chip 31 can still be effectively dissipated to the atmosphere through the exposed first surface 340a of the heat sink 34.

In order to illustrate the increase in the heat-dissipating efficiency in the present invention, a heat-dissipating performance experiment is executed for the semiconductor package 3 of the invention and conventional semiconductor packages, and the results are shown in Tables 1 to 3.

TABLE 1

Package mode of experimental object

| Package mode | | Structure I | Structure II | Structure III (the present invention) |
|---|---|---|---|---|
| Size (mm) | A | — | 0.3 | 0.3 |
| | B | 0.8398 | 0.539 | 0.2 |
| | C | — | — | 0.6144 |
| | D | 0.3048 | 03048 | 0.3048 |

TABLE 2

Specifications of package

| Specification of package | 336-pin BGA |
|---|---|
| Package size (L × W × H) | 27 × 27 × 2.33 mm |
| Chip size | 7.77 × 7.77 mm$^2$ |
| Spaced distance between two adjacent solder balls | 1.27 mm |
| Substrate thickness | 0.56 mm |
| Number of thermal balls used for heat dissipation | 36 |
| Number of copper layers of substrate | 4 layers |

TABLE 3

Experimental result (performed under condition of 6w heat energy and static air)

| Package | $\theta_{j\text{-}a}$(° C./w) |
|---|---|
| I | 9.6 |
| II | 9.0 |
| III (the present invention) | 8.4 |

Second Preferred Embodiment

Figure 2:
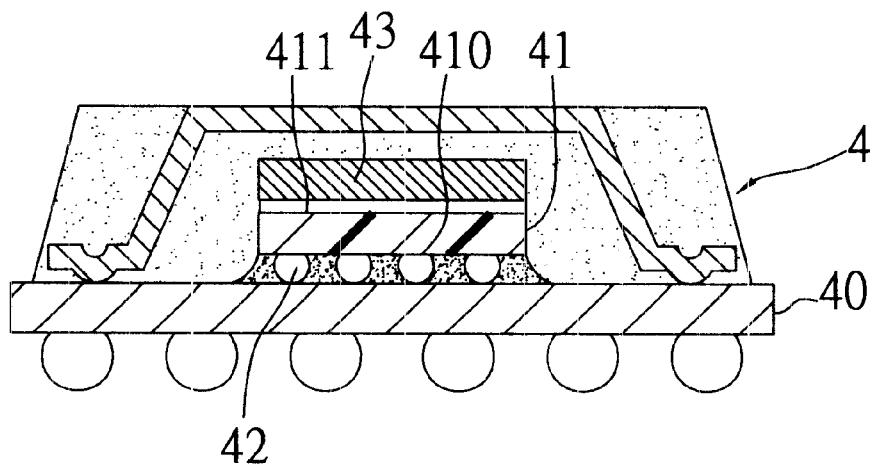
FIG. 2 is a sectional view of the semiconductor package of the second embodiment of the present invention.

FIG. 2 illustrates the semiconductor package of the second embodiment of the invention. As shown in the drawing, the semiconductor package 4 of the second embodiment is structurally identical to the first embodiment except that a semiconductor chip 41 of the semiconductor package 4 is electrically connected to a substrate 40 in a flip chip manner, that is, a first surface 410 of the semiconductor chip 41 faces downwardly to be connected to the substrate 40 through a plurality of solder bumps 42. Accordingly, a second surface 411 of the semiconductor chip 41 facing upwardly is used for attaching a lid 43 thereon, and thus the lid 43 can have the same size as the semiconductor chip 41 without affecting the electric connection between the semiconductor chip 41 and the substrate 40.

Third Preferred Embodiment

Figure 3A:
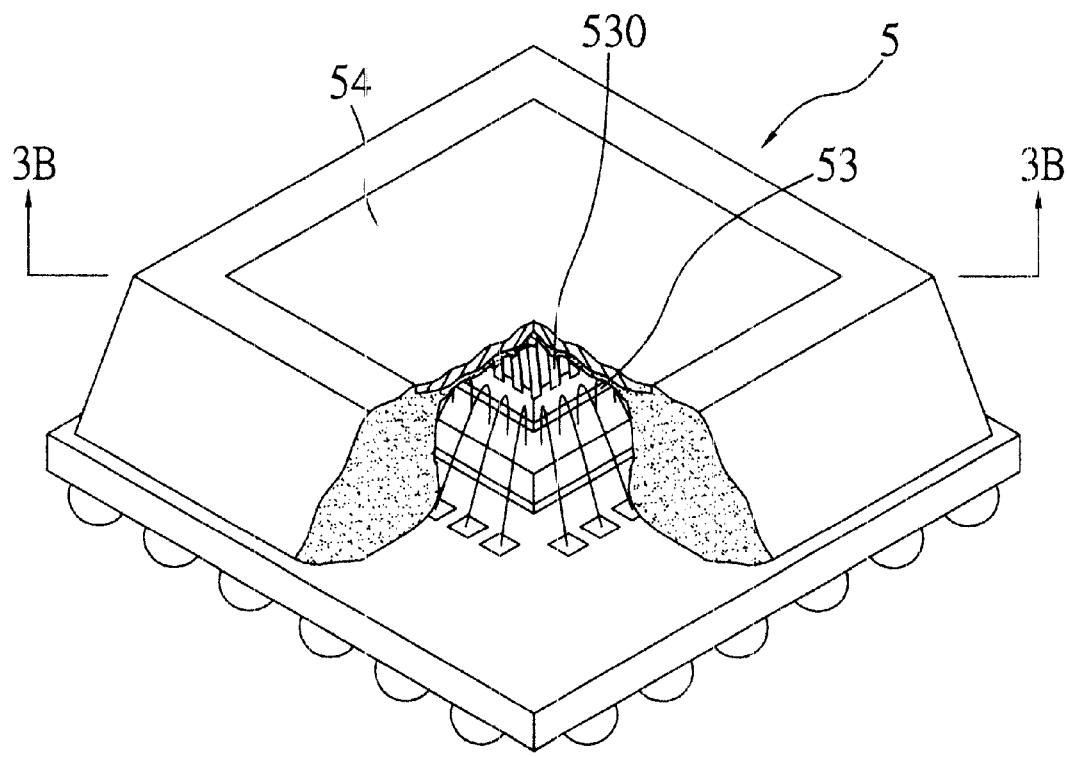
FIG. 3A is a perspective view showing the partial internal structure of the semiconductor package of the third embodiment of the present invention.
Figure 3B:
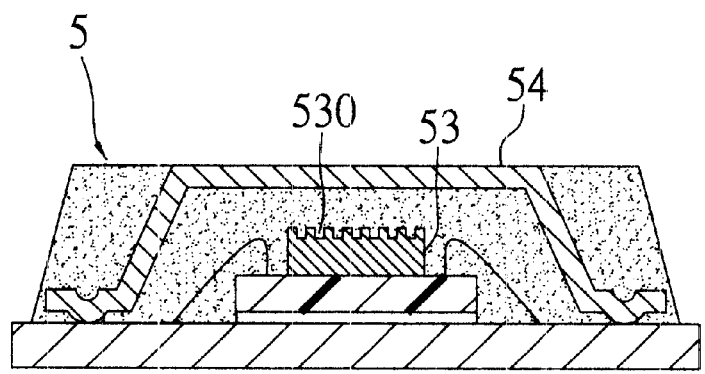
FIG. 3B is a sectional view of FIG. 3A cutting along the line 3B—3B.

Referring to FIGS. 3A and 3B, the semiconductor package 5 of the third embodiment differs in structure from the first embodiment only in that a plurality of grooves 530 are formed on a lid 53 of the semiconductor package 5 along a resin flow direction for avoiding effect on the resin flow rate and void formation between a heat sink 54 and the lid 53. Likewise, the same foregoing improvements can also be achieved as correspondingly formed the grooves on a bottom surface of the heat sink 54 located above the lid 53.

Fourth Preferred Embodiment

Figure 4:
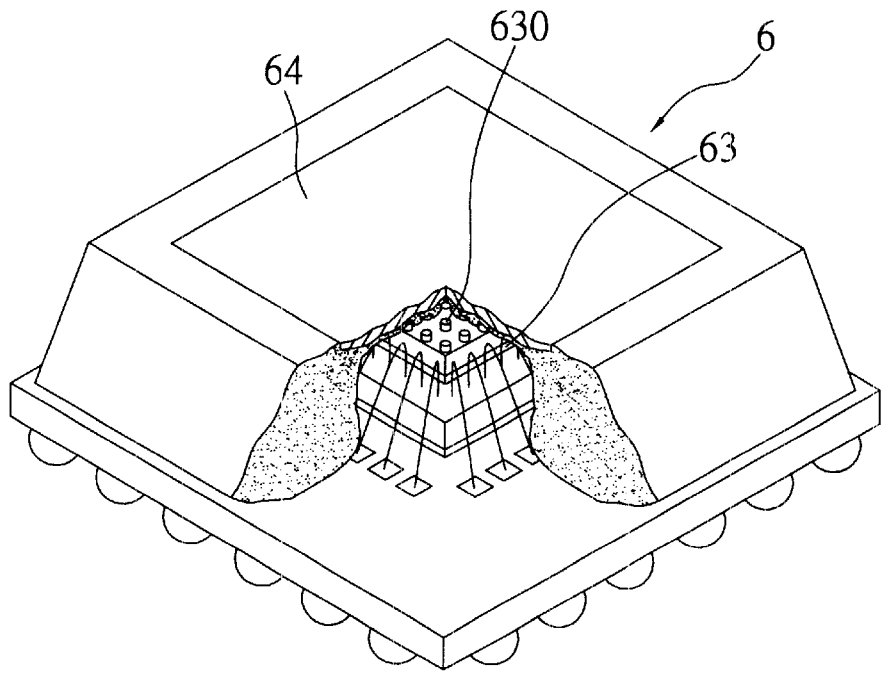
FIG. 4 is a perspective view showing the partial internal structure of the semiconductor package of the fourth embodiment of the present invention.
Figure 5:
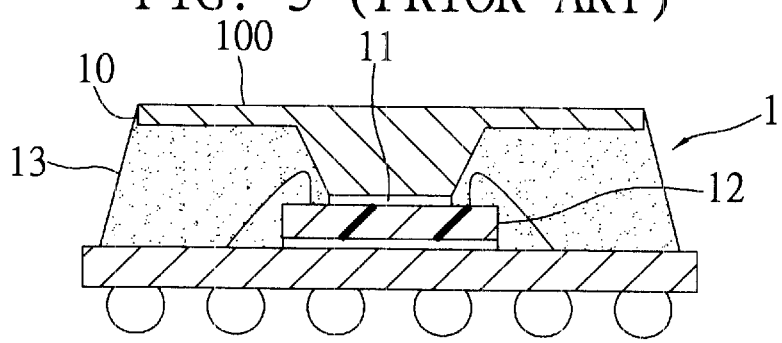
FIG. 5 (PRIOR ART) is a sectional view of a conventional semiconductor package.
Figure 6:
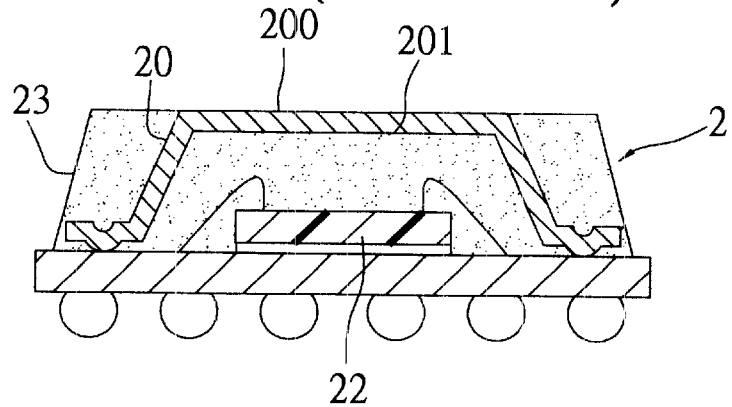
FIG. 6 (PRIOR ART) is a sectional view of another conventional semiconductor package.

Referring to FIG. 4, the semiconductor package 6 of the fourth embodiment differs from the first embodiment only in that a plurality of protrusions 630 are formed in array on a lid 63 of the semiconductor package 67 wherein flow channels are formed between adjacent rows of the protrusions 630 for passing the resin flow therethrough without affecting the resin flow rate and forming voids between a heat sink 64 and the lid 63. Likewise, the same foregoing improvements can also be achieved by correspondingly forming the protrusions on a bottom surface of the heat sink 64.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
    a substrate having a first surface and a second surface;
    a semiconductor chip having a first surface and a second surface, wherein the second surface of the semiconductor chip is attached to the first surface of the substrate;
    a plurality of first conductive members for electrically connecting the substrate to the semiconductor chip;
    a lid attached to the first surface of the semiconductor chip and having a coefficient of thermal expansion similar to that of the semiconductor chip;
    a heat sink mounted on the substrate and having a first surface and a second surface, wherein a gap is formed between the second surface of the heat sink and the lid;
    an encapsulant for encapsulating the semiconductor chip, the first conductive members, the lid and the heat sink, wherein the first surface of the heat sink is exposed to the outside of the encapsulant; and a plurality of second conductive members disposed on the second surface of the substrate for electrically connecting the semiconductor chip to an external device.

2. The semiconductor package according to claim 1, wherein the gap is preferably from 0.03 mm to 0.45 mm, and more preferably from 0.05 mm to 0.30 mm.

3. The semiconductor package according to claim 1, wherein the lid is made of a thermally conductive material.

4. The semiconductor package according to claim 1, wherein the lid is made of a semiconductor material.

5. The semiconductor package according to claim 1, wherein the lid is made of a metallic material having a coefficient of thermal expansion similar to that of the semiconductor chip.

6. The semiconductor package according to claim 1, wherein the lid is attached to the semiconductor chip by means of a thermally conductive adhesive.

7. The semiconductor package according to claim 1, wherein the first conductive members are gold wires.

8. The semiconductor package according to claim 1, wherein the second conductive members are solder balls.

9. The semiconductor package according to claim 1, wherein a plurality of flow channels are formed on the lid along a resin flow direction.

10. The semiconductor package according to claim 9, wherein the flow channels are grooves formed on lid.

11. The semiconductor package according to claim 9, wherein the flow channels are constructed by protrusions formed on the lid.

12. The semiconductor package according to claim 11, wherein a plurality of flow channels are formed along a resin flow direction on the second surface of the heat sink at positions opposing the semiconductor chip.

13. The semiconductor package according to claim 12, wherein the flow channels are grooves formed on the second surface of the heat sink.

14. The semiconductor package according to claim 12, wherein the flow channels are constructed by protrusions formed on the second surface of the heat sink.

15. A semiconductor package, comprising:

a substrate having a first surface and a second surface;

a semiconductor chip having a first surface and a second surface, wherein the first surface of the semiconductor chip is electrically connected to the first surface of the substrate in a flip chip manner;

a lid attached to the second surface of the semiconductor chip and having a coefficient of thermal expansion similar to that of the semiconductor chip;

a heat sink mounted on the substrate and having a first surface and a second surface, wherein a gap is formed between the second surface of the heat sink and the lid;

an encapsulant for encapsulating the semiconductor chip, the lid and the heat sink, wherein the first surface of the heat sink is exposed to the outside of the encapsulant; and a plurality of conductive members disposed on the second surface of the substrate for electrically connecting the semiconductor chip to an external device.

16. The semiconductor package according to claim 15, wherein the semiconductor chip is electrically connected to the substrate by means of solder bumps.

17. The semiconductor package according to claim 15, wherein the gap is preferably from 0.03 mm to 0.45 mm, and more preferably from 0.05 mm to 0.30 mm.

18. The semiconductor package according to claim 15, wherein the lid is made of a thermal conductive material.

19. The semiconductor package according to claim 15, wherein the lid is made of a semiconductor material.

20. The semiconductor package according to claim 15, where the lid is made of a metallic material having a coefficient of thermal expansion similar to that of the semiconductor chip.

* * * * *